(12) United States Patent
Katoch et al.

(10) Patent No.: US 9,443,574 B2
(45) Date of Patent: Sep. 13, 2016

(54) MEMORY ARCHITECTURE

(71) Applicant: TAIWAN SEMICONDUCTOR MANUFACTURING COMPANY, LTD., Hsinchu (TW)

(72) Inventors: Atul Katoch, Kanata (CA); Cormac Michael O'Connell, Kanata (CA)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 254 days.

(21) Appl. No.: 13/793,945

(22) Filed: Mar. 11, 2013

(65) Prior Publication Data

US 2014/0119135 A1  May 1, 2014

Related U.S. Application Data

(60) Provisional application No. 61/720,826, filed on Oct. 31, 2012.

(51) Int. Cl.
| | |
|---|---|
| *G11C 11/412* | (2006.01) |
| *G11C 8/08* | (2006.01) |
| *G11C 11/419* | (2006.01) |
| *G11C 29/02* | (2006.01) |
| *G11C 29/12* | (2006.01) |
| *G11C 29/50* | (2006.01) |

(52) U.S. Cl.
CPC .............. *G11C 11/412* (2013.01); *G11C 8/08* (2013.01); *G11C 11/419* (2013.01); *G11C 29/028* (2013.01); *G11C 2029/1202* (2013.01); *G11C 2029/5006* (2013.01)

(58) Field of Classification Search
CPC ..................................................... G11C 7/0006
USPC .............................................. 365/154, 189.07
See application file for complete search history.

(56) References Cited

U.S. PATENT DOCUMENTS

| | | | |
|---|---|---|---|
| 6,754,107 B2 | 6/2004 | Khouri et al. | |
| 7,366,006 B2 | 4/2008 | Zhang | |
| 7,483,332 B2 * | 1/2009 | Houston | ............. G11C 7/1051 365/154 |
| 2009/0073740 A1 * | 3/2009 | Ogura | ................... G11C 11/412 365/72 |
| 2010/0309736 A1 | 12/2010 | Russell et al. | |
| 2012/0069636 A1 | 3/2012 | Pelley et al. | |

OTHER PUBLICATIONS

Office Action dated Dec. 29, 2015 from corresponding No. TW 102137438.
Office Action dated May 16, 2016 from corresponding No. TW 102137438.

* cited by examiner

*Primary Examiner* — Huan Hoang
*Assistant Examiner* — Minh Dinh
(74) *Attorney, Agent, or Firm* — Hauptman Ham, LLP

(57) ABSTRACT

A first current value flowing through a transistor coupled with a storage node of a memory cell is determined when the transistor is off. A second current value flowing through the transistor is determined when the transistor is in on. A first reference voltage value at a reference node of the memory cell when the transistor is off is higher than a second reference voltage value at the reference node when the transistor is on. Based on the first current value, the second current value, and a relationship between the first current value and the second current value, a number of memory cells to be coupled with a data line associated with the memory cell is determined.

16 Claims, 6 Drawing Sheets

MEMORY ARCHITECTURE

CROSS-REFERENCE TO RELATED APPLICATION

The present application claims the priority of U.S. Provisional Application No. 61/720,826, filed Oct. 31, 2012, the disclosure of which is incorporated herein by reference in its entirety.

FIELD

The present disclosure is related to a memory architecture.

BACKGROUND

In a memory architecture, a bit line is coupled with a plurality of memory cells. Each of the memory cells has some leakage current when a pass gate transistor in the memory cell is turned off, and draws a larger current value when the pass gate transistor is turned on. For illustration, the leakage current when the pass gate transistor is turned off is called current Ioff while the current drawn by the memory cell when the pass gate transistor is turned on is called current Ion. The number of memory cells that can be coupled with a bit line depends on a ratio of current Ion of an accessed memory cell over currents Ioff of un-accessed memory cells. For example, as the ratio increases, a number of memory cells coupled with the bit line increases. The memory density of the memory architecture is higher for a larger ratio. In contrast, when the ratio is smaller, the number of memory cells capable of being coupled with the bit line is reduced, which reduces the memory density. Effectively, current Ioff of each memory cell and the ratio based on Ion and Ioff effects the density of the memory architecture.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
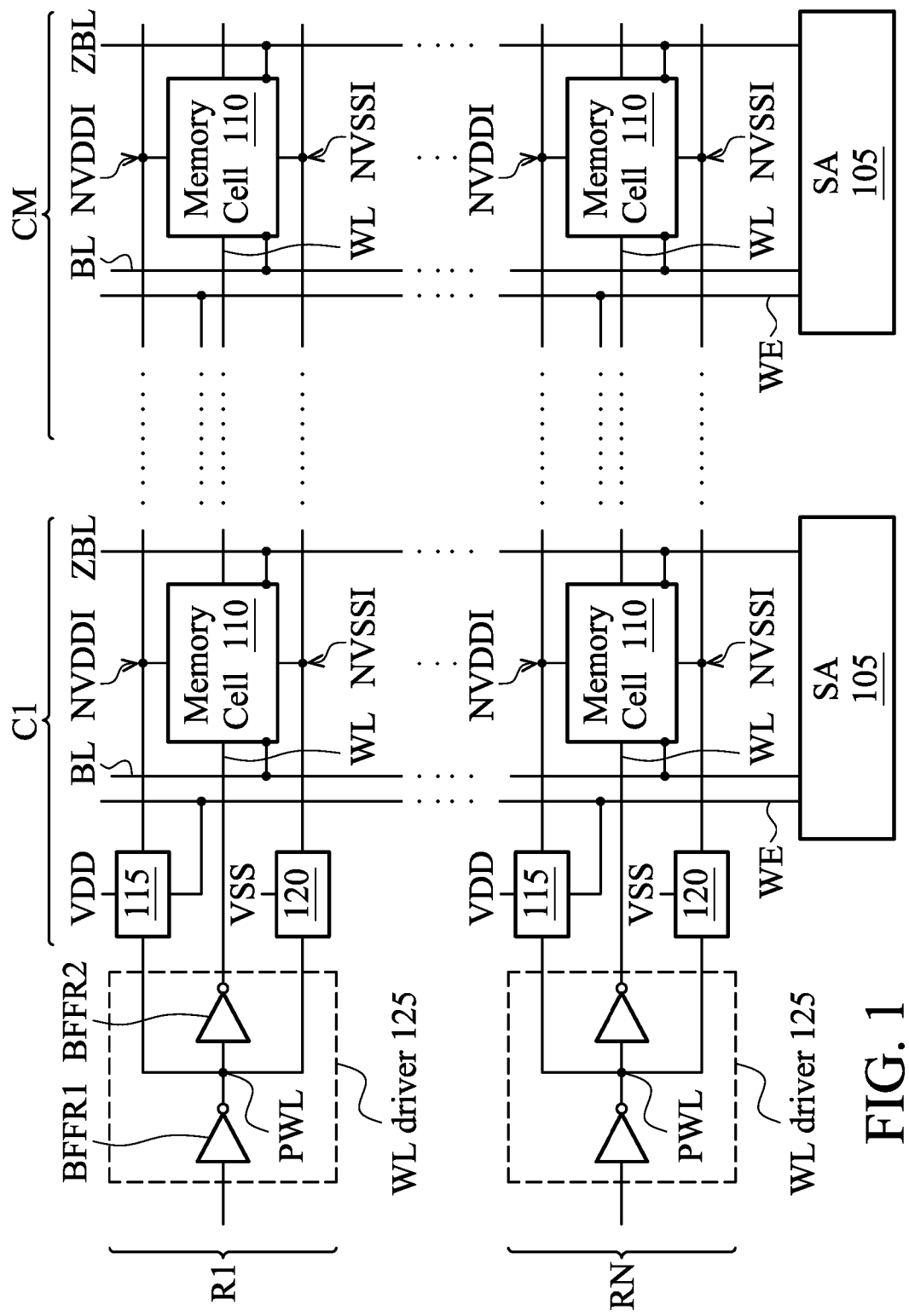
FIG. 1 is a diagram of a memory array, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. In a write operation, a supply voltage value of memory cells in an accessed row is configured to be lower than a supply voltage value of memory cells in un-accessed rows. For example, the minimum supply voltage value is lower than that of an approach in which the supply voltage value of memory cells in the accessed row is equal to the supply voltage value of memory cells in the un-accessed rows. A minimum supply voltage value used in writing data to memory cells is therefore improved.

In a read operation, a supply reference voltage value of memory cells in un-accessed rows of memory cells is configured to be higher than a supply reference voltage value of memory cells in the accessed row. As a result, a leakage current from a corresponding bit line through a pass gate transistor is reduced compared with other approaches. The number of memory cells coupled with the bit line and the memory density is therefore increased.

For illustration, a supply voltage and a supply reference voltage are called a voltage VDD and a voltage VSS, respectively.

Memory Array

FIG. 1 is a diagram of a memory array 100, in accordance with some embodiments. Memory array 100 is a static random access memory (SRAM) array. Other types of memory are within the scope of various embodiments.

Memory array 100 includes a plurality of rows and columns of memory cells 110. For illustration, N rows from row R1 to row RN, and M columns from column C1 to column CM are shown. N and M are each an integer number. For illustration, a row of memory cells 110 is called a row R, and a column of memory cells 110 is called a column C.

Each row R includes a word line (WL) driver 125 configured to provide a word line signal WLS (not labeled) on a word line WL for memory cells 110 on a corresponding row R. WL driver 125 includes a buffer BFFR1 and a buffer BFFR2. Buffer BFFR1 generates a signal PWL. In some embodiments, signal PWL is generated before signal WLS is generated. For example, signal WLS is signal PWL delayed by a time delay provided by buffer BFFR2. Word line WL activates a corresponding row R of memory cells 110. A supply voltage control circuit 115, based a corresponding signal PWL, provides an internal supply voltage VDDI (not labeled) to nodes NVDDI of memory cells 110 in a corresponding row R. In some embodiments, internal supply voltage VDDI is applied to memory cells 110 based on a corresponding signal PWL before memory cells 110 are activated based on a corresponding signal WLS on word line WL. WL driver 125 having two buffers BFFR1 and BFFR2 is for illustration. Other configurations of WL driver 125 are within the scope of various embodiments.

Supply voltage control circuit 115 receives supply voltage VDD and transfers supply voltage VDD as an internal supply voltage VDDI to nodes NVDDI of memory cells 110 in a corresponding row R. In some embodiments, supply control circuit 115 provides internal supply voltage VDDI to nodes NVDDI before buffer BFFR2 activates a corresponding word line WL. Supply voltage control circuit 115 also provides a write enable signal WE to corresponding sense amplifiers 105, labeled as SA 105, when corresponding memory cells 110 are under a write operation.

A reference supply voltage control circuit 120 receives reference supply voltage VSS and transfers reference supply voltage VSS as an internal reference supply voltage VSSI (not labeled) to nodes NVSSI of memory cells 110 in a corresponding row R. Supply voltage control circuit 120, based on corresponding signal PWL, provides an internal supply reference voltage VSSI to nodes NVSSI of memory cells 110 in a corresponding row R. In some embodiments, reference supply voltage control circuit 120 provides internal supply reference voltage VSSI to memory cells 110 based on a corresponding signal PWL before memory cells 110 are activated based on a corresponding signal WLS on word line WL.

A column C includes a plurality of memory cells 110 and a sense amplifier (SA) 105. SA 105 is used to sense or read the data stored in memory cell 110 through a bit line split of bit lines BL and ZBL in a corresponding column C. When a bit line split of bit lines BL and ZBL is sufficiently developed, SA 105 is turned on to sense or amplify the bit line split and generate a full swing signal on bit lines BL and ZBL that represent the data read from the corresponding memory cell 110. SA 105 also receives write enable signal WE as an input. For example, when write enable signal WE is activated with a high logical value, corresponding memory cells 110 are in a write operation, and corresponding SA 105 is turned off. In contrast, when write enable signal WE is deactivated with a low logical value, corresponding SA 105 is turned on to sense data in corresponding memory cells 110.

For illustration, in a write operation when signal WE is logically high, nodes NVDDI of memory cells 110 in the accessed row R receive a voltage value VDDIWA (not labeled). Nodes NVDDI of memory cells in the un-accessed rows receive a voltage value VDDIWUA (not labeled). A voltage difference between voltage value VDDIWA and VDDIWUA is called ΔVDDIW. Mathematically expressed, ΔVDDIW=VDDIWUA−VDDIWA. In some embodiments, voltage value VDDIWA is lower than voltage value VDDIWUA. Further, voltage value VDDIWUA has a VDD voltage value, such as 1.0 V, while voltage value VDDIWA is about 0.9 V. Voltage difference ΔVDDIW is therefore about 0.1 V. Other voltage values of voltage ΔVDDIW are within the scope of various embodiments.

In some embodiments, in a write operation, nodes NVSSI of memory cells 110 in the accessed row R receive a voltage value VSSIWA (not labeled), and nodes NVSSI of memory cells 110 in the un-accessed rows R receive a voltage value VSSIWUA (not labeled). For illustration, a value of voltage difference between voltage value VSSIWA and VSSIWUA is called ΔVSSIW (not labeled). Mathematically expressed, ΔVSSIW=VSSIWUA−VSSIWA. In some embodiments, voltage value VSSIWA is equal to voltage value VSSIWUA. Further, voltage value VSSIWA and voltage value VSSIWUA each has a VSS voltage value, such as ground or 0.0 V. Voltage ΔVSSIW is therefore about 0.0 V. Other values of voltage ΔVSSIW are within the scope of various embodiments.

For illustration, in a read operation when signal WE is deactivated, nodes NVDDI of the accessed row R receive a voltage value VDDIRA (not labeled). Nodes NVDDI of the un-accessed rows R receive a voltage value VDDIRUA (not labeled). A voltage difference between voltage value VDDIRA and VDDIRUA is called ΔVDDIR. Mathematically expressed, ΔVDDIR=VDDIRA−VDDIRUA. In some embodiments, voltage value VDDIRA is equal to voltage value VDDIRUA. Voltage ΔVDDIR is therefore 0 V. Further, voltage value VDDIRUA is the same as the VDD voltage value, such as 1.0 V. Explained in a different way, nodes NVDDI of both the accessed row and un-accessed rows stay at a voltage value of supply voltage VDD. Other voltage values for voltage VDDIRA and VDDIRUA are within the scope of various embodiments.

In some embodiments, in a read operation, nodes NVSSI of accessed row R receive a voltage value VSSIRA (not labeled), and nodes NVDDI of the un-accessed rows R receive a voltage value VSSIRUA (not labeled). A voltage value difference between voltage value VSSIRA and VSSIRUA is called ΔVSSIR. Mathematically expressed, ΔVSSIR=VSSIRUA−VSSIRA. In some embodiments, voltage value VSSIRA is lower than voltage value VSSIRUA. Further, voltage value VSSIRA has a VSS voltage value, such as ground or 0 V, while voltage value VDDIRUA is about 0.1 V. Voltage ΔVSSIR is therefore about 0.1 V. Other values of voltage ΔVSSIR are within the scope of various embodiments.

Memory Cell

Figure 2:
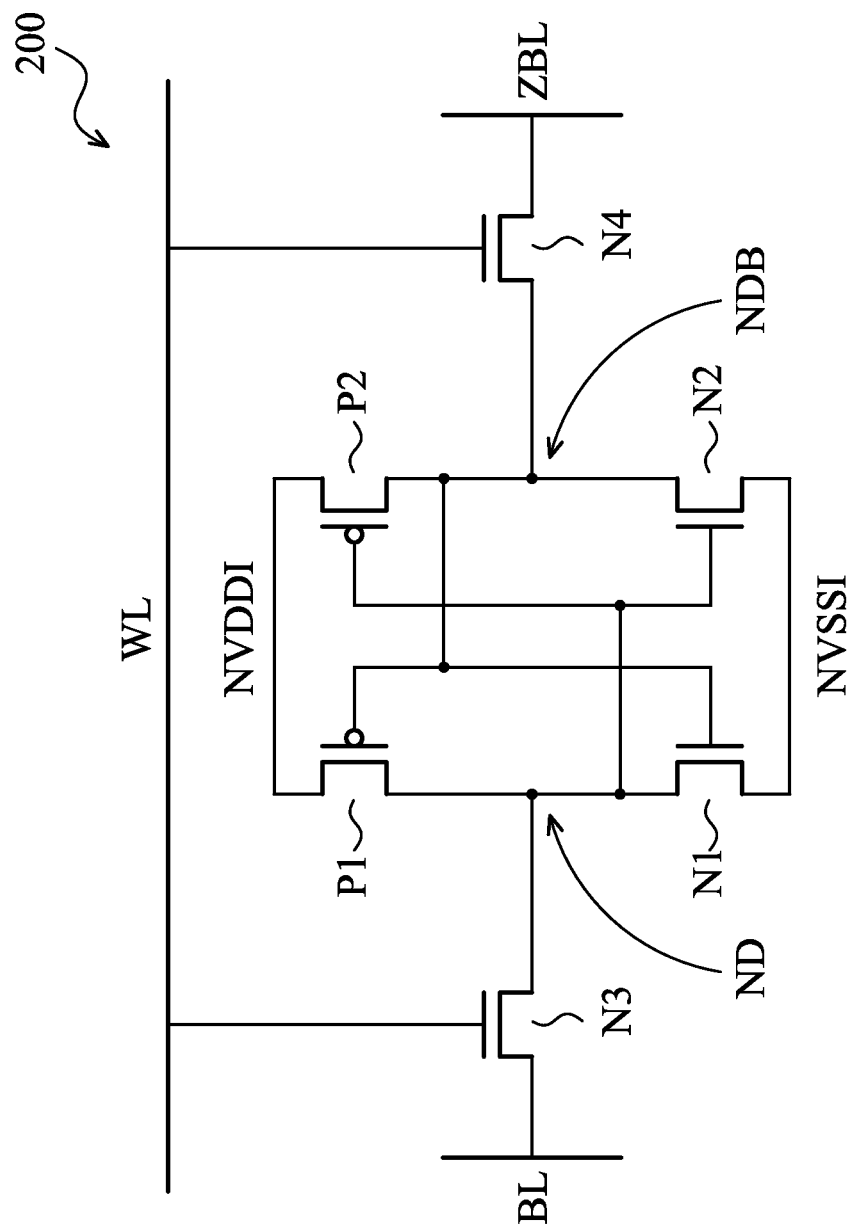
FIG. 2 is a diagram of a memory cell of the memory array of FIG. 1, in accordance with some embodiments.

FIG. 2 is a diagram of a memory cell 200, in accordance with some embodiments. Memory cell 200 is an embodiment of memory cell 110 in FIG. 1.

Memory cell 200 includes two P-type metal oxide semiconductor (PMOS) transistors P1 and P2, and four N-type metal oxide semiconductor (NMOS) transistors N1, N2, N3, and N4. Transistors P1, P2, N1, and N2 form a cross latch. Sources of transistors P1 and P2 are coupled together and serve as node NVDDI.

Each node NVDDI of a plurality of memory cells 200 is coupled together and receives a voltage value from a corresponding supply voltage control circuit 115 in FIG. 1. For example, depending on whether memory cell 200 is in a read or a write operation and whether memory cell 200 is in an accessed row R or in an un-accessed row R, node NVDDI receives a corresponding voltage value VDDIWA, VDDIWUA, VDDIRA, or VDDIRUA.

Drains of transistors P1 and N1 are coupled together and form a storage node ND. Drains of transistors P2 and N2 are coupled together and form a storage node NDB. Gates of transistors P1 and N1 are coupled together and to drains of transistors P2 and N2. Gates of transistors P2 and N2 are coupled together and to drains of transistors P1 and N1. Sources of transistors N1 and N2 are coupled together and serve as node NVSSI.

Each node NVSSI of a plurality of memory cells 200 is coupled together and receives a voltage value from a corresponding reference supply voltage control circuit 120 in FIG. 1. For example, depending on whether memory cell 200 is in a read or a write operation and whether memory cell 200 is in an accessed row R or in an un-accessed row R, node NVSSI receives a voltage value VSSIWA, VSSIWUA, VSSIRA, or VSSIRUA.

Word line WL is coupled with a gate of each of transistors N3 and N4 of a plurality of memory cells 200 in a row R in FIG. 1. Word line WL is also called a write control line because a signal on word line WL controls transistors N3 and N4 for data on bit lines BL and ZBL to be written to corresponding nodes ND and NDB.

Drains of each of transistors N3 and N4 are coupled to bit lines BL and ZBL, respectively. Bit lines BL and ZBL are coupled to each drain of transistors N3 and N4 of a plurality of memory cells 200 in a column C in FIG. 1. Each of bit lines BL and ZBL is also called a data line because the data carried on bit lines BL and ZBL are written to corresponding nodes ND and NDB. In some other situations, the data stored in nodes ND and NDB are also transferred to bit lines BL and ZBL to be sensed by SA 105 in FIG. 1.

Bit lines BL and ZBL serve as both data input and output for memory cell 200. In some embodiments, in a write operation, applying a logical value to a first bit line and the opposite logical value to the other bit line enables writing the logical values at the bit lines to memory cell 200. A voltage difference between bit line BL and bit line ZBL is called a bit line split. In a read operation, the data in storage nodes ND and NDB are transferred to bit lines BL and ZBL. Sensing a bit line split of bit lines BL and ZBL reveals the data stored in memory cell 200.

For simplicity, bulks of transistors P1, P2, N1, N2, N3, and N4 in memory cell 200 are not shown. In some embodiments, the bulks of PMOS transistors, such as transistors P1 and P2, are configured to receive supply voltage value VDD, and the bulks of NMOS transistors, such as transistors N1, N2, N3, and N4 are configured to receive reference supply voltage VSS.

For illustration, node ND stores a high logical value, and bit line BL is pulled to a low logical value so that node ND is written with a low logical value. Node NVDDI is at a source of transistor P1 and word line WL is at gate of transistor N3. In some embodiments, in a write operation, voltage VDDIWA at node NVDDI of an accessed memory cell 110 is applied with a voltage value lower than a high voltage value of word line WL, which, in some embodiments, is about supply voltage VDD. As a result, transistor P1 conducts weaker than transistor N3. Consequently, it is easier for node ND to flip to a low logical value than the situation in which transistor P1 conducts as strong as or stronger than transistor N3. As a result, various embodiments of the present disclosure are advantageous over some approaches in which voltage VDDIWA remains at supply voltage value VDD. Effectively, memory cell 200 of various embodiments of the present disclosure functions at a lower voltage VDD than some other approaches.

When node ND stores a low logical value, node NDB stores a high logical value. In some embodiments, writing node ND with a high logical value is based on writing node NDB with a low logical value. Writing node NDB with a low logical value with reference to transistor P2, transistor N4, and bit line ZBL is similar to writing node ND with a low logical value with reference to transistor P1, transistor N3, and bit line BL as explained above.

In some embodiments, in a read operation, voltage VSSIRA at node NVSSI of the accessed row R is kept at voltage value VSS, and voltage VSSIRUA at node NVSSI of un-accessed rows R is raised compared with voltage value VSS. For illustration, node ND stores a low logical value. Because voltage VSSIRUA at node NVSSI of un-accessed rows R is raised compared with voltage VSS, node ND is also raised. In other words, node ND has a higher voltage value than voltage VSS or ground. In a read operation, bit line BL is pre-charged to a high logical value. In memory cells 200 of un-accessed rows R, word line WL is de-activated, and transistor N3 is turned off. A leakage current leaks from the high logical value of bit line BL through transistor N3 to node ND, however. Because node ND is raised, the leakage current from bit line BL to node ND is reduced when compared with the situation in which a voltage value of node NVSSI and node ND is not raised, such as when voltage VSSIRUA is equal to voltage VSS. In some embodiments, voltage VSSIRUA of un-accessed rows R is raised to a predetermined voltage value such that the data stored in memory cells 200 in the accessed row R continues to be reliably valid. In some embodiments, the predetermined voltage level is set such that if voltage VSSIRUA is raised higher than the predetermined voltage value, the data in memory cells 200 in the accessed row R is no longer be valid.

Further, in some embodiments, the bulk of transistor N3 is at voltage value VSS while the source of transistor N3 or node ND is raised. As a result, a body effect of transistor N3 raises a threshold voltage of transistor N3, and the leakage current through transistor N3 is further reduced based on the body effect.

When node ND stores a high logical value, node NDB stores a low logical value. In some embodiments, reading a high logical value from node ND is based on reading a low logical value of node NDB. Reading a low logical value of node NDB with references to transistor N2, transistor N4, and bit line ZBL is similar to reading a low logical value of node ND with references to transistor N1, transistor N3, and bit line BL as explained above.

Leakage Current and a Number of Memory Cells Coupled to a Bit Line

For illustration, a current flowing through transistor N3 when transistor N3 is on is called a current Ion, and a current flowing through transistor N3 when transistor N3 is off is called a current Ioff. In some embodiments, transistor N3 is on when memory cell 200 is in an accessed mode, such as in a read operation. Further, transistor N3 is off when memory cell 200 is in an un-accessed mode. Explained in a different way, in an accessed row R, transistors N3 are turned on, and in an un-accessed row R, transistors N3 are turned off. For illustration, each column C includes N numbers of memory cells 200 wherein N is an integer number. In some embodiments, with respect to a column C, one memory cell 200 is read accessed while N−1 memory cells 200 are not read accessed. Current Ion is a current of the read accessed memory cell 200 in column C. For illustration, the total current in N−1 memory cells 200 of un-accessed rows R of column C is called Ioffcolumn. As a result, mathematically expressed, Ioffcolumn=Ioff*(N−1).

In some embodiments, a number of memory cells 200 (or 110) that can be coupled with bit line BL of a column C depends on a ratio RAT (not labeled) of current Ion over current Ioffcolumn. When ratio RAT is increased, a larger number of memory cells 200 can be coupled with bit line BL. In such situation, N has a larger value. In contrast, when ratio RAT is decreased, a lower number of memory cells 200 are able to be coupled with bit line BL. In such a situation, N has a smaller value. In some embodiments, current Ion is selected to be about ten times current Ioffcolumn or higher so that reading data of a memory cell 200 on bit line BL is reliable. As a result, ratio RAT is about ten or higher. If ratio RAT is less than ten, the number of memory cells 200 coupled with bit line BL is reduced in some embodiments, for example. A method to determine the number of memory cells 200 coupled with bit line BL is explained with reference to FIG. 5 below. In some embodiments having the raised VSSIRUA at a predetermined voltage value, the number of memory cells 200 coupled with bit line BL is at least two times higher than approaches which do not include the raised VSSIRUA.

In the above description, bit line BL and corresponding node ND are used for illustration, analyses with respect to bit line ZBL and corresponding node NDB are similar.

Writing to a Memory Cell

Figure 3:
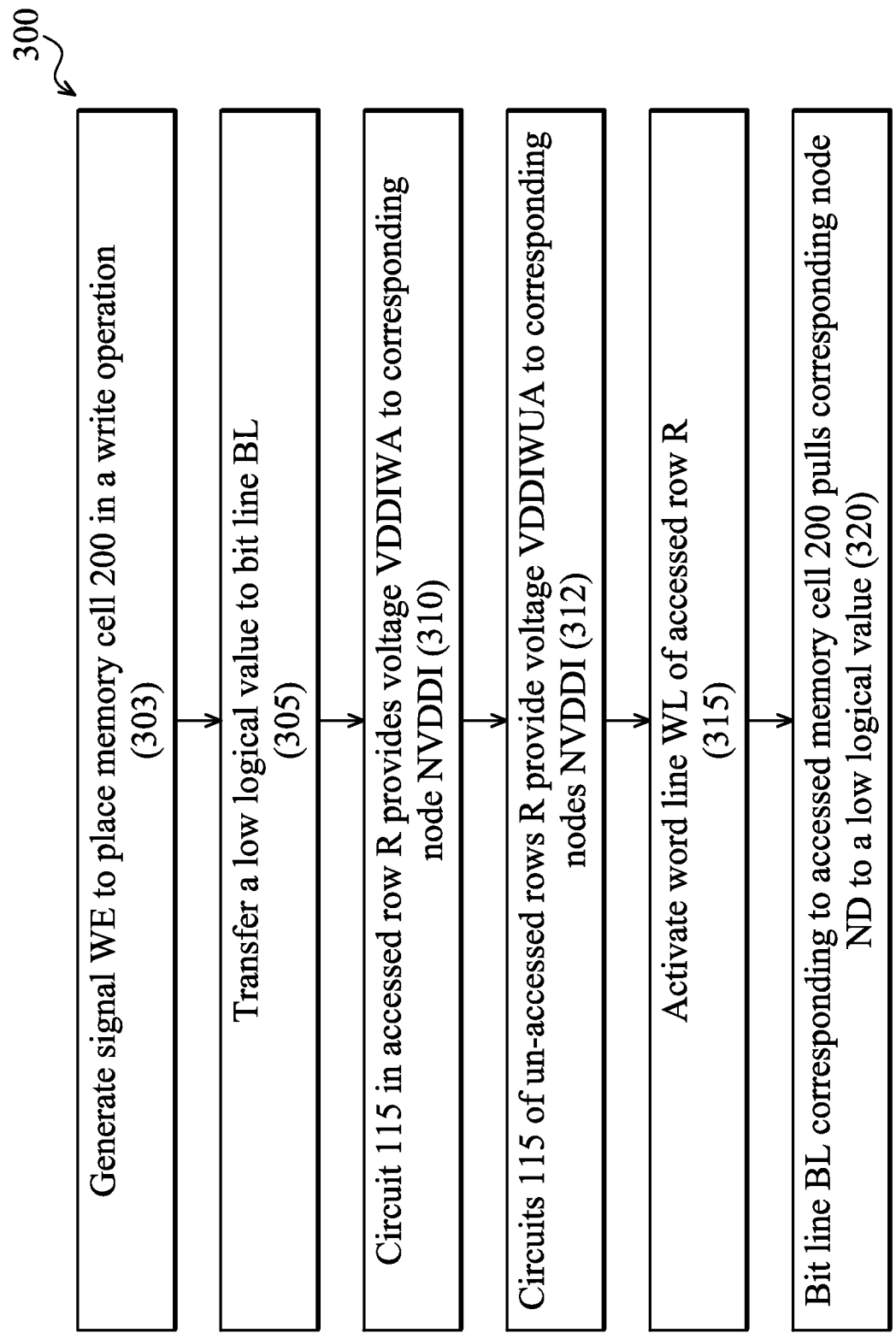
FIG. 3 is a flowchart of a method for writing to a row of memory cell, in accordance with some embodiments.

FIG. 3 is a flowchart of a method 300 for writing to a memory cell 200 in a write accessed row R of FIG. 1, in accordance with some embodiments. For illustration, node ND stores a high logical value, and is written with a low logical value.

In operation 303, voltage control circuit 115 in accessed row R in FIG. 1 generates write enable signal WE having a high logical value to put accessed memory cell 200 in a write operation.

In operation 305, a low logical value is transferred to bit line BL, for example, by a circuit outside of memory array 100.

In operation 310, voltage control circuit 115 in the accessed row R in FIG. 1 is configured to provide corresponding node NVDDI of memory cell 200 with a voltage VDDIWA that is lower than supply voltage VDD used as a high logical value for word line WL.

In operation 312, voltage control circuits 115 of un-accessed rows R are configured to provide corresponding nodes NVDDI of memory cells 200 with voltage VDDI-WUA that is about supply voltage VDD.

In operation 315, word line WL of accessed row R is activated. As a result, transistor N3 in FIG. 2 of accessed memory cell 200 in accessed row R is turned on.

In operation 320, bit line BL corresponding to accessed memory cell 200 pulls corresponding node ND to a low logical value. In other words, node ND is written with a low logical value. Because node NVDDI of accessed memory cell 200 has a voltage value VDDIWA lower than a high logical value VDD of word line WL, transistor N3 of accessed memory cell 200 conducts stronger than corresponding transistor P1. As a result, node ND flips to a low logical value easier with less contention effects from transistor P1. In other words, writing to node ND is easier.

Reading from a Memory Cell

Figure 4:
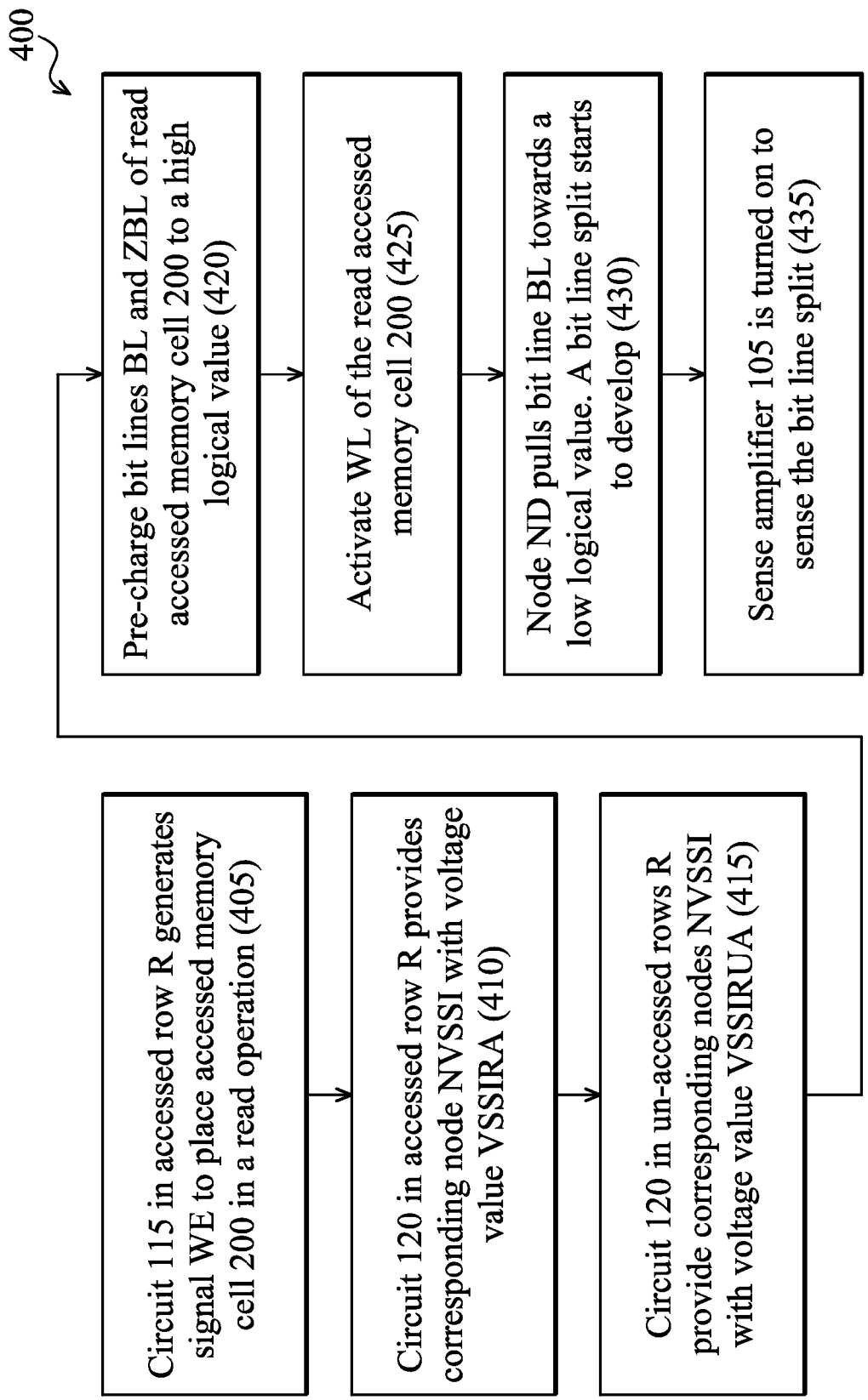
FIG. 4 is a flowchart of a method for reading from a row of memory cells, in accordance with some embodiments.

FIG. 4 is a flowchart of a method 400 for reading from node ND of a memory cell 200 of a read accessed row R, in accordance with some embodiments. For illustration, node ND stores a low logical value.

In operation 405, voltage control circuit 115 in accessed row R provides write enable signal WE having a low logical value to place accessed memory cell 200 in a read operation.

In operation 410, voltage control circuit 120 in accessed row R provides corresponding node NVSSI of read accessed memory cell with voltage value VSSIRA, which is about supply voltage VSS.

In operation 415, voltage control circuits 120 in un-accessed rows R provide corresponding nodes NVSSI with voltage value VSSIRUA that is raised compared with supply voltage VSS. In un-accessed rows R, transistors N3 are turned off, but are subject to a leakage current, however. Because voltage VSSIRUA is raised compared with voltage VSS, nodes ND of memory cells in un-accessed row R are also raised. The leakage current through transistors N3 is therefore reduced compared with the situation in which voltage VSSIRUA is not raised. The body effect of transistor N3 further reduces the leakage current.

In operation 420, bit lines BL and ZBL are pre-charged to a high logical value.

In operation 425, WL of the read accessed memory cell 200 is activated with a high logical value to turn on transistor N3.

In operation 430, the low logical value of node ND pulls bit line BL towards a low logical value. Bit line ZBL stays at the same pre-charged high logical value. In other words, a bit line split between bit lines BL and ZBL starts to develop.

In operation 435, when the bit line split is sufficiently large for SA 105 to sense, SA 105 is turned on. SA 105 recognizes bit line BL is lower than bit line ZBL and reveals the logical data of node ND.

A Number of Memory Cells Coupled with a Bit Line

Figure 5:
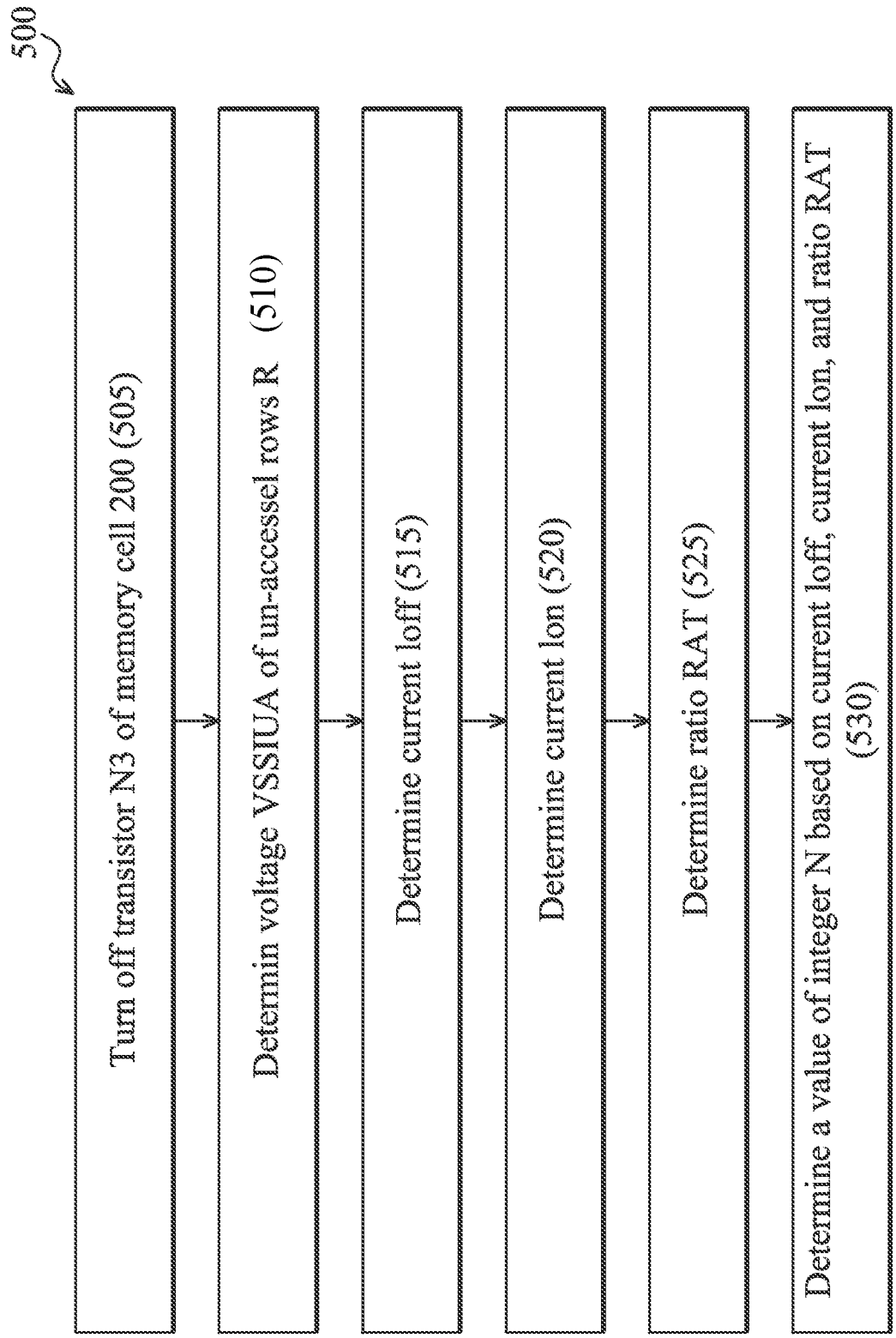
FIG. 5 is a flowchart of a method for determining a number of memory cells coupled to a bit line, in accordance with some embodiments.

FIG. 5 is a flowchart of a method 500 for determining a number N of memory cells 200 coupled with bit line BL, in accordance with some embodiments. In this illustration, a memory cell 200 in an accessed row R is used.

In operation 505, transistor N3 of memory cell 200 is turned off.

In operation 510, voltage VSSIRUA at node NVSSI of un-accessed rows R is determined. For example voltage VSSIRUA is selected at a voltage value higher than voltage VSS such that memory cell 200 fails. In other words, voltage VSSIRUA is raised, but memory cell 200 fails. In some embodiments, in such a situation, the data stored in memory cell 200 is not reliably valid. Voltage VSSIRUA is then decreased until the data stored in memory cell 200 is reliably valid. For example, node ND stores a high logical value. Voltage VSSIUA is first selected such that the data in node ND is not reliably logically high. Voltage VSSIUA is then decreased until the data in node ND is reliably logically high. But if node ND stores a low logical value, voltage VSSIRUA is first selected such that the data in node ND is not reliably logically low. Voltage VSSIRUA is then decreased until the data in node ND is reliably logically low. Effectively, voltage VSSIRUA is raised compared with voltage VSS, and memory 200 functions validly. In that way, the leakage current in un-accessed rows R is reduced. As a result, the number of memory cells coupled with a bit line, such as bit BL, for example, increases. Different ways to determine voltage VSSIRUA are within the contemplated scope of the present disclosure. For example, voltage VSSIRUA is determined based on a binary search algorithm. For another example, voltage VSSIRUA is set at 0 V and increased until the data stored in memory cell 200 is not reliably valid, and a value of voltage VSSIRUA prior to the data stored in memory cell 200 is not reliably valid is used in memory array 100.

In operation 515, a worst-case current leaked through transistor N3 is considered current Ioff. Alternatively stated, current Ioff is determined. In some embodiments, current Ioff is available based on characteristics of transistor N3. In some other embodiments, current Ioff is determined by simulation.

In operation 520, current Ion is determined. In some embodiments, current Ion is available based on characteristics of transistor N3. In some other embodiments, current Ion is determined by simulation.

In operation 525, a value for ratio RAT is chosen. For example, ratio RAT being at least 10 is applicable, and the value 10 is chosen. For illustration, RATVALMIN refers to the minimum value of ratio RAT, and is 10 in this example. Another value of ratio RAT different from 10 is within the scope of various embodiments. Mathematically expressed, $$RAT = I_{on}/I_{off}\text{column} >= 10 \text{ or}$$

$$I_{on}/((I_{off})*(N-1)) >= 10 \text{ or}$$

$$N <= (I_{on}/(10*I_{off})) + 1 \quad (1)$$

In operation 530, a value of integer N is selected based on equation (1). For example, integer N is selected to be equal to $(I_{on}/(10*I_{off})) + 1$.

In some embodiments, the number N is determined for one column and is used for all columns of memory array 100. In other words, each column C of memory array 100 has a same number of N memory cells 200.

Computer

Figure 6:
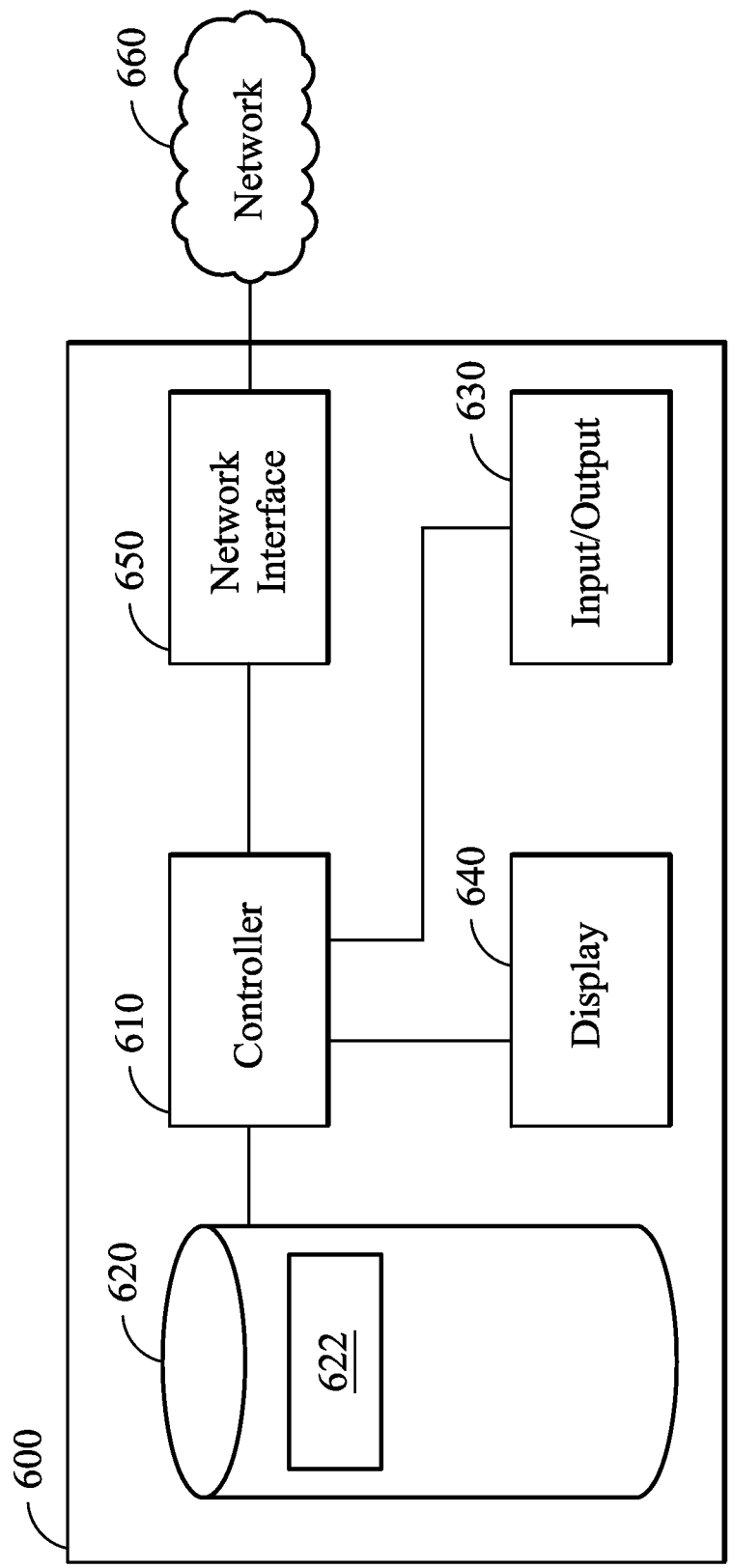
FIG. 6 is a diagram of a computer, in accordance with some embodiments.

FIG. 6 is a functional block diagram of a computer system 600, in accordance with some embodiment. In some embodiments, computer 600 is used to implement various methods of the present disclosure, including, for example, methods 300, 400, and 500 in FIGS. 3, 4, and 5, respectively.

A controller 610 controls logic, processes information, and coordinates activities of computer system 600. For example, controller 610 is configured to execute computer program code 622 to cause computer 600 to implement methods 300, 400, and 500. In some embodiments, controller 610 is a central processing unit (CPU), a multi-processor, a distributed processing system, an application specific integrated circuit (ASIC), and/or a suitable processing unit.

Computer readable storage medium 620 includes program code or a set of executable instructions 622. Storage medium 620 also stores information including, for example, information used to perform methods 300, 400, and 500, information generated during performing methods 300, 400, and 500, etc. In some embodiments, storage medium 620 is a non-transitory storage medium.

In some embodiments, storage medium 620 is an electronic, magnetic, optical, electromagnetic, infrared, and/or a semiconductor system, apparatus, or device. For example, storage medium 620 includes a semiconductor or solid-state memory, a magnetic tape, a removable computer diskette, a random access memory (RAM), a read-only memory (ROM), a rigid magnetic disk, and/or an optical disk. In some embodiments, storage medium 620 includes a compact disk-read only memory (CD-ROM), a compact disk-read/write (CD-R/W), and/or a digital video disc (DVD).

An input-output interface 630 enables a programmer to provide data to computer system 600, to manipulate computer system 600 to perform methods 300, 400, and 500, for example.

A display 640 displays information to users of computer 600, including, for example, a status of operations of methods 300, 400, and 500. In some embodiments, display 640 includes a graphical user Interface (GUI). In some embodiments, input-output interface 630 and display 640 enable a user to operate computer system 600 in an interactive manner.

A network interface 650 enables computer system 600 to communicate with a network 660, to which one or more other computer systems are connected. Network interface 650 includes wireless network interfaces such as BLUETOOTH, WIFI, WIMAX, GPRS, or WCDMA. Alternatively and/or additionally network interface 650 includes a wired network interface such as an ETHERNET, USB, or IEEE-1394 port. In some embodiments, computer system 600 and at least one computer on network 660 operate to perform functions of computer system 600 as describe above.

In some embodiments, a first current value flowing through a transistor coupled with a storage node of a memory cell is determined when the transistor is off. A second current value flowing through the transistor is determined when the transistor is in on. A first reference voltage value at a reference node of the memory cell when the transistor is off is higher than a second reference voltage value at the reference node when the transistor is on. Based on the first current value, the second current value, and a relationship between the first current value and the second current value, a number of memory cells to be coupled with a data line associated with the memory cell is determined.

In some embodiments regarding a method of writing data to a storage node of a memory cell, a first voltage value is applied to a data line associated with the memory cell. A control line associated with the memory cell is activated to store a logical value at the storage node based on the first voltage value applied to the data line. The control line has a second voltage value representing a first logical value of the control line and a third voltage value representing a second logical value of the control line. A fourth voltage value at a supply voltage node of the memory cell is lower than the second voltage value and higher than the third voltage value. The supply voltage node of the memory cell is coupled with supply voltage nodes of other memory cells in a same row.

In some embodiments regarding a method of reading data from a memory cell, a data voltage value is applied to a first data line associated with a first storage node of the memory cell and to a second data line associated with a second storage node of the memory cell. A first control line associated with the memory cell is activated so that a logical value at the first storage node or at the second storage node causes a voltage split between the first data line and the second data line. The voltage split is sensed to determine data stored at the first storage node or at the second storage node. A first node voltage value at a reference supply voltage node of the memory cell is lower than a second node voltage value of a reference supply voltage node of another memory cell that is associated with a second control line different from the first control line. The reference supply voltage node of the memory cell is coupled with reference supply voltage nodes of corresponding memory cells in a first row. The reference supply voltage node of the another memory cell that is in a second row different from the first row is coupled with reference supply voltage nodes of corresponding memory cells in the second row.

In some embodiments, a memory array comprises a plurality of memory cells arranged in a plurality of rows and a plurality of columns. Supply voltage nodes of memory cells in a row of the plurality of rows are coupled together, and are electrically separated from supply voltage nodes of memory cells in another row. Reference supply voltage nodes of memory cells in the row of the plurality of rows are coupled together, and are electrically separated from reference supply voltage nodes of memory cells in the another row.

A number of embodiments have been described. It will nevertheless be understood that various modifications may be made without departing from the spirit and scope of the disclosure. For example, various transistors being shown as a particular dopant type, such as an N-type or a P-type Metal Oxide Semiconductor (NMOS or PMOS), are for illustration purposes. Embodiments of the disclosure are not limited to a particular type. Selecting different dopant types for a particular transistor is within the scope of various embodiments. A low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A method comprising:
determining a first current value flowing through a transistor coupled with a storage node of a memory cell when the transistor is off;
determining a second current value flowing through the transistor when the transistor is on, wherein a first reference voltage value at a reference node of the memory cell when the transistor is off is higher than a second reference voltage value at the reference node when the transistor is on; and
based on the first current value, the second current value, and a relationship between the first current value and the second current value, determining a number of memory cells to be coupled with a data line associated with the memory cell.

2. The method of claim 1, wherein
determining the first current comprises determining the first reference voltage at a value at which data stored in the memory cell is not reliably valid and at a value at which the data stored in the memory cell is reliably valid.

3. The method of claim 1, wherein
the second reference voltage value and a voltage value at a bulk of the transistor are each at a ground level.

4. The method of claim 1, wherein
the memory cell further comprises another storage node coupled with another data line.

5. The method of claim 1, wherein
the second reference voltage value at the reference node when the transistor is on is at a ground level.

6. The method of claim 1, wherein determining the number of memory cells to be coupled with the data line is based on an equation:

$$RAT = Ion/(Ioff*(N-1)),$$

where Ion represents the first current value;
Ioff represents the second current value;
RAT represents the relationship between the first current value and the second current value; and
N represents the number of memory cells to be coupled with the data line associated with the memory cell.

7. The method of claim 6, wherein
RAT>RATVALMIN; and
RATVALMIN represents a minimum value of ratio RAT.

8. The method of claim 1, wherein
a control line coupled with a gate of the transistor is coupled with gates of transistors in a same row with the transistor.

9. The method of claim 1, wherein the data line associated with the memory cell is coupled with a sense amplifier for use in sensing data of the memory cell.

10. A method of writing data to a storage node of a memory cell, comprising:
applying a first voltage value to a data line associated with the memory cell; and
activating a control line associated with the memory cell, to store a logical value at the storage node based on the first voltage value applied to the data line,
wherein
the control line has a second voltage value representing a first logical value of the control line and a third voltage value representing a second logical value of the control line;
a fourth voltage value at a supply voltage node of the memory cell is lower than the second voltage value and higher than the third voltage value; and
the supply voltage node of the memory cell is coupled with supply voltage nodes of other memory cells in a first row.

11. The method of claim 10, wherein
the second voltage value is at a value of a supply voltage.

12. The method of claim 10, wherein
a fifth voltage value at a supply voltage node of memory cells in a second row different from the first row is at a voltage value higher than the fourth voltage value.

13. The method of claim 10, wherein
the memory cell includes another storage node associated with another data line.

14. The method of claim 10, wherein
a fifth voltage value at a reference supply voltage node of the memory cell is equal to a sixth voltage value at a reference supply voltage node of another memory cell in a second row different from the first row.

15. A method comprising:
applying a data voltage value to a first data line associated with a first storage node of a memory cell and a second data line associated with a second storage node of the memory cell;
activating a first control line associated with the memory cell so that a logical value at the first storage node or at the second storage node causes a voltage split between the first data line and the second data line; and
reading data from the memory cell by sensing the voltage split to determine the data stored at the first storage node or at the second storage node,
wherein
a first reference node voltage value at a reference supply voltage node of the memory cell is lower than a second reference node voltage value of a reference supply voltage node of another memory cell associated with a second control line different than the first control line;
the reference supply voltage node of the memory cell is coupled with reference supply voltage nodes of corresponding memory cells in a first row; and
the reference supply voltage node of the another memory cell that is associated with the second control line is coupled with reference supply voltage nodes of corresponding memory cells in a second row that is different from the first row.

16. The method of claim 15, wherein
a supply voltage value at a supply voltage node of the memory cell is equal to a supply voltage value at the another memory cell.

* * * * *